(12) United States Patent
Kurth

(10) Patent No.: US 6,462,266 B1
(45) Date of Patent: Oct. 8, 2002

(54) PHOTOVOLTAIC CELL AND METHOD FOR THE PRODUCTION THEREOF

(75) Inventor: Martin Kurth, Zuchwil (CH)

(73) Assignee: Kurth Glas & Spiegel AG, Zuchwil (CH)

( * ) Notice: Subject to any disclaimer, the term of this patent is extended or adjusted under 35 U.S.C. 154(b) by 0 days.

(21) Appl. No.: 09/913,117
(22) PCT Filed: Feb. 5, 2000
(86) PCT No.: PCT/CH00/00062
§ 371 (c)(1),
(2), (4) Date: Aug. 7, 2001
(87) PCT Pub. No.: WO00/48212
PCT Pub. Date: Aug. 17, 2000

(30) Foreign Application Priority Data

| Feb. 8, 1999 | (CH) | 0252/99 |
| Feb. 8, 1999 | (CH) | 0253/99 |
| Feb. 8, 1999 | (CH) | 0254/99 |
| Feb. 15, 1999 | (CH) | 028199 |

(51) Int. Cl.$^7$ .................. H01G 9/20; H01G 31/048
(52) U.S. Cl. ............... 136/251; 136/259; 257/433; 438/64; 438/66; 438/98; 427/74
(58) Field of Search .......... 136/251, 259; 257/433; 438/64, 66, 98; 427/74

(56) References Cited

U.S. PATENT DOCUMENTS 4,847,669 A * 7/1989 Yamazaki et al. .......... 136/251
6,153,824 A * 11/2000 Takada et al. .......... 136/263

FOREIGN PATENT DOCUMENTS

| DE | 4303055 A1 | * | 8/1993 |
| DE | 19528401 A1 | * | 2/1997 |
| EP | 536738 A2 | * | 4/1993 |
| WO | WO-96/29715 A1 | * | 8/1996 |

OTHER PUBLICATIONS

Sugimura et al, "Electrical Isolation and Electrochemical Corrosion in Thin–Film Photovoltaic Modules," 20th IEEE Photovoltaic Specialists Conference, Sep. 26–30, 1988, pp. 1103–1109.*

* cited by examiner

Primary Examiner—Alan Diamond
(74) Attorney, Agent, or Firm—Ann W. Speckman; Janet Sleath

(57) ABSTRACT

A new photovoltaic cell is described, in particular a dye or solar cell having electrically conducting coatings on spaced, glass support panes. In its border zones, the cell is provided with a circumferentially extending seal. Furthermore, the electrically conductive conductor leads are protected against corrosion by an insulating coating on the side facing the cell inside. A method of manufacture of a photovoltaic cell of the type mentioned is described in which the electrically conductive leads are applied using a screen printing process.

19 Claims, 4 Drawing Sheets

PHOTOVOLTAIC CELL AND METHOD FOR THE PRODUCTION THEREOF

CROSS-REFERENCE TO RELATED APPLICATION

This application is a national phase filing of PCT International Application No. PCT/CH00/00062, filed Feb. 5, 2000, which claims priority of Swiss Patent Application Nos. CH252/99, filed Feb. 8, 1999; CH253/99, filed Feb. 8, 1999; CH254/99, filed Feb. 8, 1999; and CH281/99, filed Feb. 15, 1999.

BACKGROUND

From WO-A-93/18532 a photoelectrochemical cell is known which consists of two thin conductive glass layers adjoined each by transparent thicker isolating layers. The core of the cell is formed by a porous titanium dioxide layer acting as an electrode. Between the porous titanium dioxide layer and the thin conductive glass layers a thin diffusion layer of non-porous titanium dioxide is arranged. The principle of this arrangement of a photovoltaic cell, which has become known among experts also under the name of Graetzel cell, can be gathered from EP-B-0 525 070 in which mainly the composition of the suitable dyes is dealt with.

In spite of attempts by various parties to commercialize a Graetzel type cell, up to now production of a photochemical cell of the type mentioned above with sufficient size has not been There are further patent documents (e.g. DE-A-34 41 044 and EP-A-0 528 212) referring to the application of the conductive layers, in particular metal or metal oxide layers, onto thin conductive glass panes. In addition, for manufacturing of dye solar cells of the type mentioned above the application of technologies is known from EP-A-0 739 020 and EP-A-0 582 212 which permit step by step forming of the desired layer stack in successive print processes. Between the successive printing steps thermal curing of each layer may be required. The desired result of a homogeneous stack of layers requires, as is made clear by the known technologies, strict observance of the processing parameters specified, such as e.g. substrate concentration, temperature, and duration of reactions. Especially in step by step forming of dye cells the various used materials should be matched concerning their coefficients of expansion. achieved or successfully achieved thus far. Also the efficiency of these cells still is very unsatisfactory, which is another reason why commercial success thus far has not been achieved. Furthermore, manufacturing costs of the known modules are still too high, which prevents economical application on a large scale.

SUMMARY OF THE INVENTION

It thus is the objective of the present invention to propose a phtovoltaic cell and a method of its manufacture, which achieves high economic feasability and best reliability.

This objective is met by a photovoltaic cell presented by the features according to patent claim 1 and by a method of manufacture presented by the features according to patent claim 10.

The inventive photovoltaic cell presents the important advantage that using a relatively simple structure particularly effective sealing of the cell is achieved. It has proven particularly advantageous if butyl rubber or similar materials are used as sealing materials. In the manufacturing method it has proven particularly suitable if utmost care is taken in cleaning the glass panes in a plurality of cleaning steps in order to achieve optimum adherence of the conductive layers on the glass substrate and to avoid formation of larger bubbles during the coating of the glass cover.

BRIEF DESCRIPTION OF THE DRAWINGS

Further advantages of the present invention are explained in the dependent patent claims and in the following description in which the present invention is described in more detail with reference to a design example illustrated schematically in the corresponding figures. It is shown in:

In the figures the elements shown identically each are referred to using the same reference signs, and descriptions given first apply to all figures unless stated otherwise.

Figure 1:
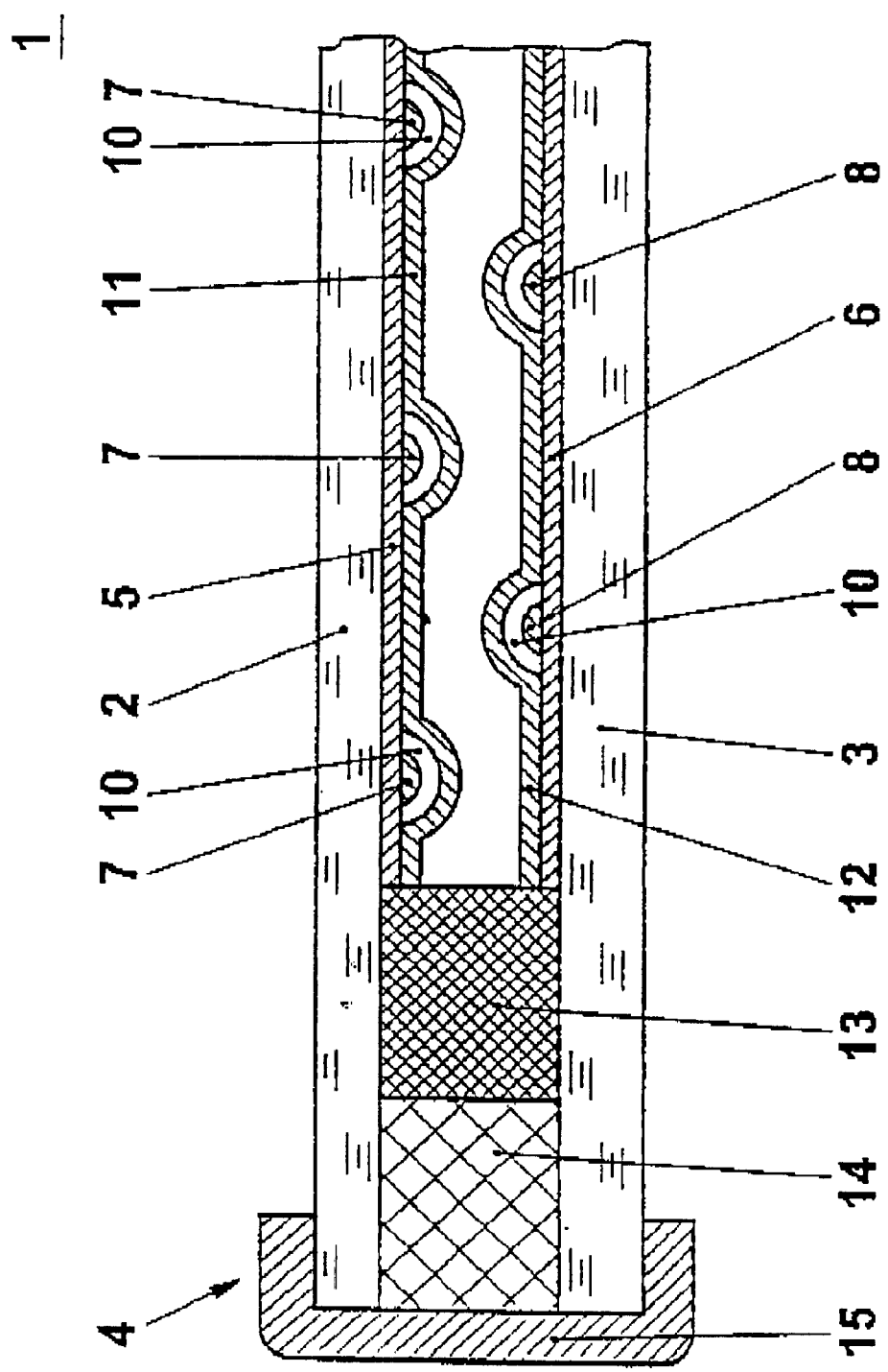
FIG. 1 a cross-section of a photovoltaic cell.

In the FIG. 1 a portion of a photovoltaic cell 1 is shown in a cross-section with two mutually distanced support panes 2 and 3, which in their border zones are held by a sealing system 4 which extends along the whole circumference. The support panes 2 and 3 are made from a pre-tensioned silicate glass, preferentially a colourless (white) glass, in which arrangement the surfaces facing each other are coated each with a conductive layer 5, and 6 respectively. The layers 5 and 6 are formed by a suitable metal or metal oxide, in the present case SnO2. On these layers 5 and 6 each an arrangement of parallel conductor leads 7 and 8 are provided, preferentially made from silver or from a silver alloy. They also can be made from copper or from a copper alloy. These conductor leads are coated each with an insulating coating 10 which insulates the conductor leads 7 and 8 electrically towards the interior of the cell. The coating 10 consists of a glass free of heavy metals, in particular with a minimal contents of bismuth and/or tin which was applied as a glass flow on the conductor leads 7 and 8. Onto the conductor leads 7 and 8 insulated by the glass coating 10 a further electrically conductive layer 11, and 12 respectively, made from tin oxide or a similar material each can be applied in order to obtain a still higher yield of the photovoltaic cell 1. The circumferential sealing system 4 presents a first circumferentially extending seal 13 made from a silicon rubber or of a hot adhesive or "hot melt" available under the trade name "Bynel" using which the two glass panes 2 and 3 are interconnected. Outside this first seal 13 a second seal 14, in particular made from butyl rubber is provided extending circumferentially. The first seal 13 in this arrangement acts as a water vapor restricting seal and the second seal 14 as water vapor barrier which arrangement ensures optimum sealing of the photovoltaic cell 1. In the border zones of the two seals 13 and 14 no electrically conductive layers 5 and 6 are provided, i.e. such layers have been eliminated from this zone using a sandblasting process. In this manner possible short circuits between the two electrodes 5 and 6 via the seals 13 and/or 14 are avoided. Onto these two seals furthermore a thin layer 15 of a low melt soldering tin is applied in such a manner that exterior weather influences also can not act onto the photovoltaic cell 1. The distance maintained between the two support panes 2 and 3 ranges from about 50 µm to 70 µm. The glass panes 2 and 3 themselves are of a thickness ranging approximately from 1.5 to 3.5 mm, preferentially about 1.8 mm.

Figure 3:
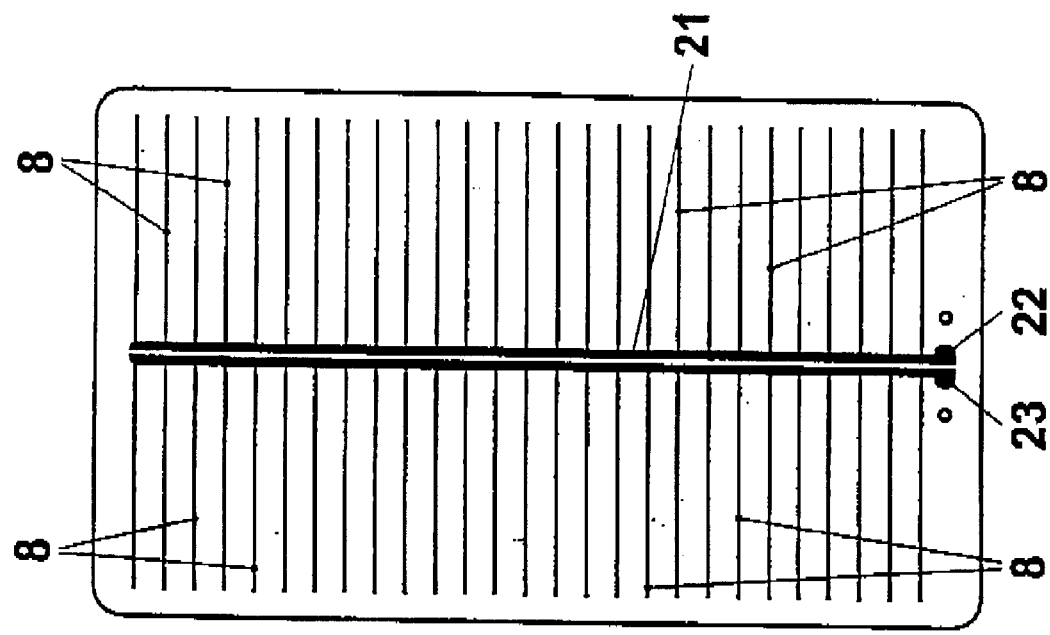
FIG. 3 a top view of a second support pane
Figure 2:
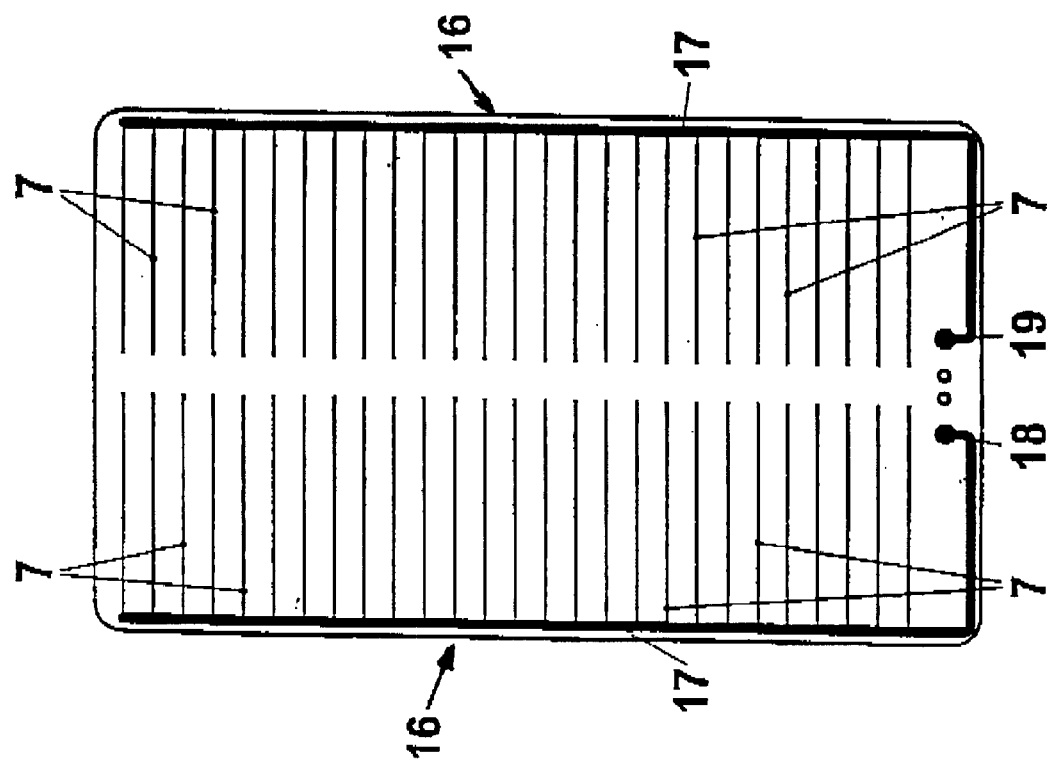
FIG. 2 a top view of a first support pane of the cell according to FIG. 1.
Figure 4:
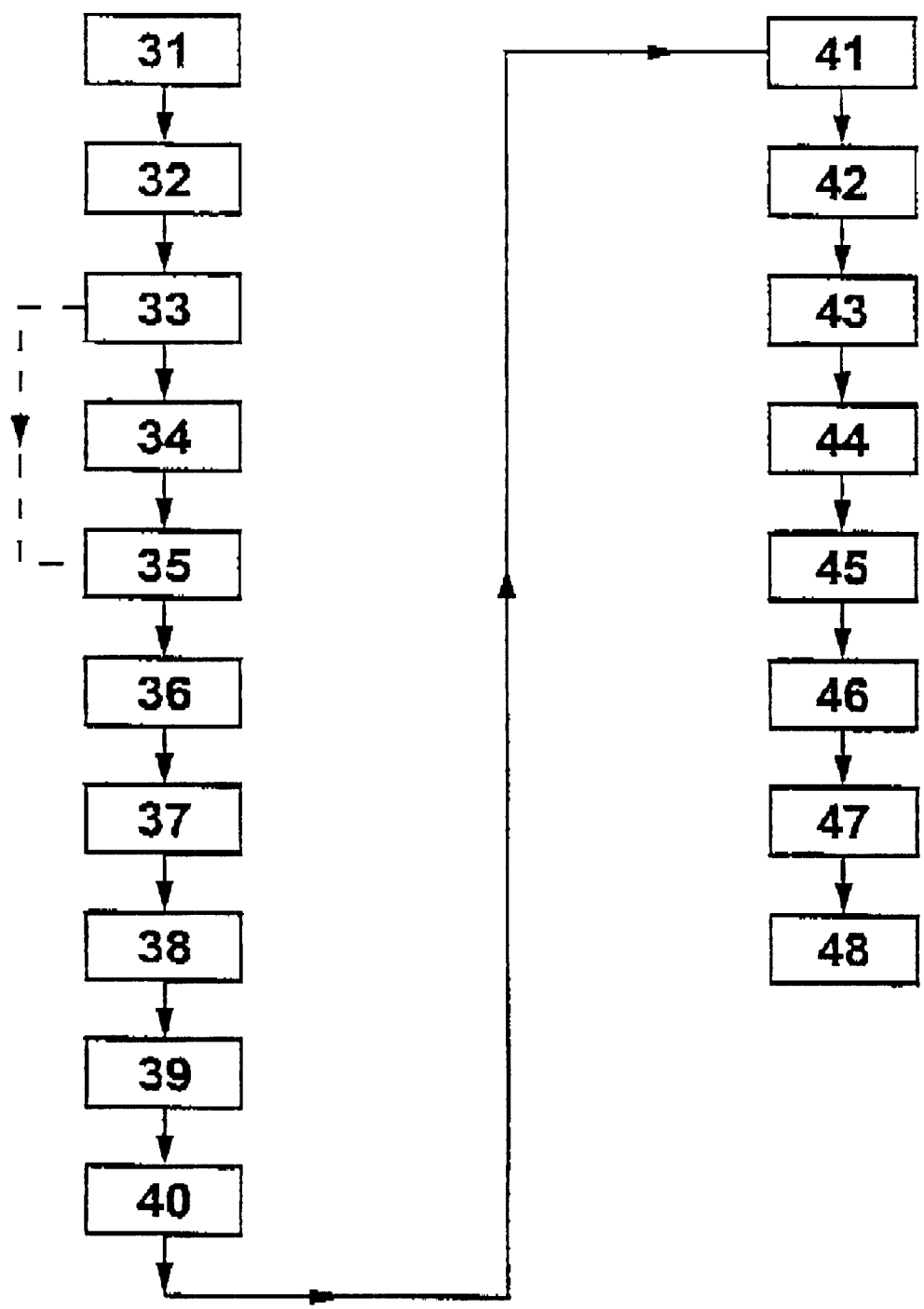
FIG. 4 a schematic view of the sequence of the processing steps of the method of manufacturing a photovoltaic cell of this type, and in the FIG. 5 an array of a plurality of photovoltaic cells of this type in a solar module.

In FIG. 2, now the lay-out of the conductor leads 7 on the first support pane 2 is shown. The conductor leads 7 in this arrangement are arranged mutually parallel as fingers ending approximately at the centre of the support glass pane 2. These conductor leads 7 on both sides merge in the border zone 16 of the glass pane 2 into collecting conductor leads 17, which at the lower border zone lead to two contacting ports 18 and 19. In FIG. 3, the lay-out of the conductor leads 8 of the second support glass pane 3 is shown, which also are arranged as parallel fingers ending in the border zone, and at the center, merge into two collecting conductor leads 21 arranged mutually parallel and at right angles with respect to the fingers extending to the contacting ports 22 and 23.

The manufacture of an inventive module is effected in the processing sequence illustrated schematically in FIG. 7.

In a first step 31 the overall contour of the glass panes 2 and 3 are cut roughly to the dimensions desired for the modules to be produced from large glass plates of an overall thickness of 1.0 to 3.5 mm, preferentially of about 1.8 to 2.2 mm. Using a high pressure water jet beam the glass panes 2 and 3 then are cut to their final form—process step 32. Using the water jet technology and diamond and/or stone cutting tools furthermore bores, cut-out areas, rounded corners, grooves or profiled edges can be formed on the glass panes 2 and 3 as required for the applications intended. Thereafter the glass panes 2 and 3 are cleaned in a thorough cleaning process 33 which includes several washing processes using a 4% solvent solution in an ultrasonic cleaning facility after which cleaning process no fat or lipid residues or dust particles remain on the glass surfaces. A cleaning process of this type is known as such in the manufacturing process of liquid crystal displays ("LCD").

Thereafter the conductive layers 5 and 6 consisting of a suitable metal oxide such as SnO2 are applied evenly to the entire surfaces of the glass panes 2 and 3 in a spraying process. The area resistance of the layers 5 and 6 evenly applied in this manner should not exceed 15 W/cm2 and they should resist temperatures of up to about 1000° C. Also ready-made glass panes with an electrically conductive coating can be used which after cutting to its proper size—process step 32—are cleaned in the cleaning procedure in such a manner that the process step 34 can be dispensed with (processing sequence indicated with dashed lines). Such glass panes coated with tin oxide are available under the name of TCO-glass from Asahi Glass Company Ltd., Tokyo, Japan.

Subsequently in a screen printing step 35 the conductor leads 7 and 8 are evenly applied in the form of a conductive metal paste containing metals such as silver or copper. Thereupon the conductor lead system is dried in a drying process 36 at temperatures of about 600° C. in a tunnel kiln and is baked onto the coated glass surface and is chilled using a cooled air stream—process step 37. Thereafter the glass panes 2 and 3 in a further cleaning procedure 38 are washed again using a suitable cleaning fluid in such a manner that no residues whatever remain on the surfaces. The individual conductor leads 7 and 8 then in a further screen printing step 39 are coated with a very thin glass flow. Advantageously a glass free of heavy metals with very low contents of bismuth and/or tin is used for this purpose. The resulting coating is dried first by heat irradiation and then in an infrared radiation of the near infrared range, i.e. in the range of 0.7 to 1.5 mm is baked in at a temperature of about 700° C. —process step 40. In order to achieve hermetic sealing of the conductor leads 7 and 8 the two process steps described above, i.e. coating with a glass flow and subsequent drying, are repeated several times. The layer thickness of each glass coating then is about 10 to 25 µm. The total thickness of the final glass coating 10 in this arrangement is to be ranging from 50 to 70 µm.

Owing to this process step 40 the coated and pre-processed glass panes 2 and 3 simultaneously are thermally pre-stressed during about 50 to 80 seconds and subsequently in the cooling process step 41 are shock-chilled in a cold air stream. In this pre-stressing process step 41 the glass panes are moved to and fro at an oscillating frequency of approximately 0.5 seconds in a tunnel kiln with rolls made from a ceramic material arranged in its lower part and subdivided in a plurality of heating zones with temperatures increasing stepwise from about 550° C. to 750° C. in such a manner that the glass panes are kept floating slightly above the rolls owing to an air stream created in the process. Proper setting of the lowermost and of the uppermost temperatures and of the oscillating frequency of the rolls in this process are mutually adapted in such a manner that so-called bow and stern waves in the glass panes can be avoided to a very great extent which as a rule would be generated with glass panes of a thickness of less than 2.5 mm. Thus glass panes 2 and 3 of excellent planarity are obtained, tensions simultaneously being built up in the glass resulting in a high temperature change resistance of the glass panes 2 and 3. Thus also higher resistance against bending and tensile stress is achieved in the glass which is most important mainly in applications in photovoltaic cells such as dye solar cells and similar devices. Furthermore relaxation of the glass panes 2 and 3 over a time span of about one hour can be provided in such a manner that the completed cell which is to be subdivided into a plurality of part areas for the purpose can be cut into smaller units using a water jet or a similar device.

The glass panes 2 and 3 treated in the manner described now in their border zones are provided with a sealing system 4, where in the process step 42 the electrically conductive layers 5, 11, and 6, 12 respectively, applied to the glass panes 2 and 3 are eliminated from the zone mentioned using a sand blasting process or a similar process. Subsequently in a process step 43 the first seal 13 made from silicon rubber is applied in a very thin layer to the two glass panes 2 and 3 in such a manner that a distance of about 50 mm to 70 mm is maintained between the glass panes 2 and 3. In the next process step 44 a second seal 14 made from butyl rubber is applied. In practical use the two process steps 43 and 44 are effected simultaneously. Subsequently the whole circumference of the photovoltaic cell 1 thus produced is sealed using low melting soldering tin—process step 45.

The cell 1 thus produced is filled in the filling process step 46 with an organic solvent as an electrolyte, such as described in detail in EP-B-0 525 070, via a filling opening (not shown in more detail here) provided in one of the glass panes 2 and 3 this opening being sealed subsequently using a suitable adhesive—process step 47. As a filling opening a glass passage or capillary by the Schott Company, Mainz, Germany, can be applied through the glass rod 12 or through one of the glass panes 2 and 3 (compare product information No. 4830/1 d by the Schott Company). The final photovoltaic cell or dye cell 1 thus is completed. In a last process step 48 the completed cell 1 is checked for tightness and functional operability for which purpose the cell 1 is e.g. submerged over a predetermined time period in hot water while its electrical function is tested simultaneously. For this purpose the completed cell 1 also can be heated to a temperature of about 65° C. to 90° C. at the most. It is understood that the cell 1 produced in the manner described not only is suited for taking up electrolytes of the type mentioned above but that also other photovoltaic substances can be filled in.

Glass panes produced according to the manufacturing method described above can be produced the energy consumed being less than 3 kWh per kg. As no special coatings are applied which can not, or under great difficulties only, be eliminated, modules consisting of glass panes of the type mentioned after their useful life span can be recycled and re-used in simple manner.

Figure 5:
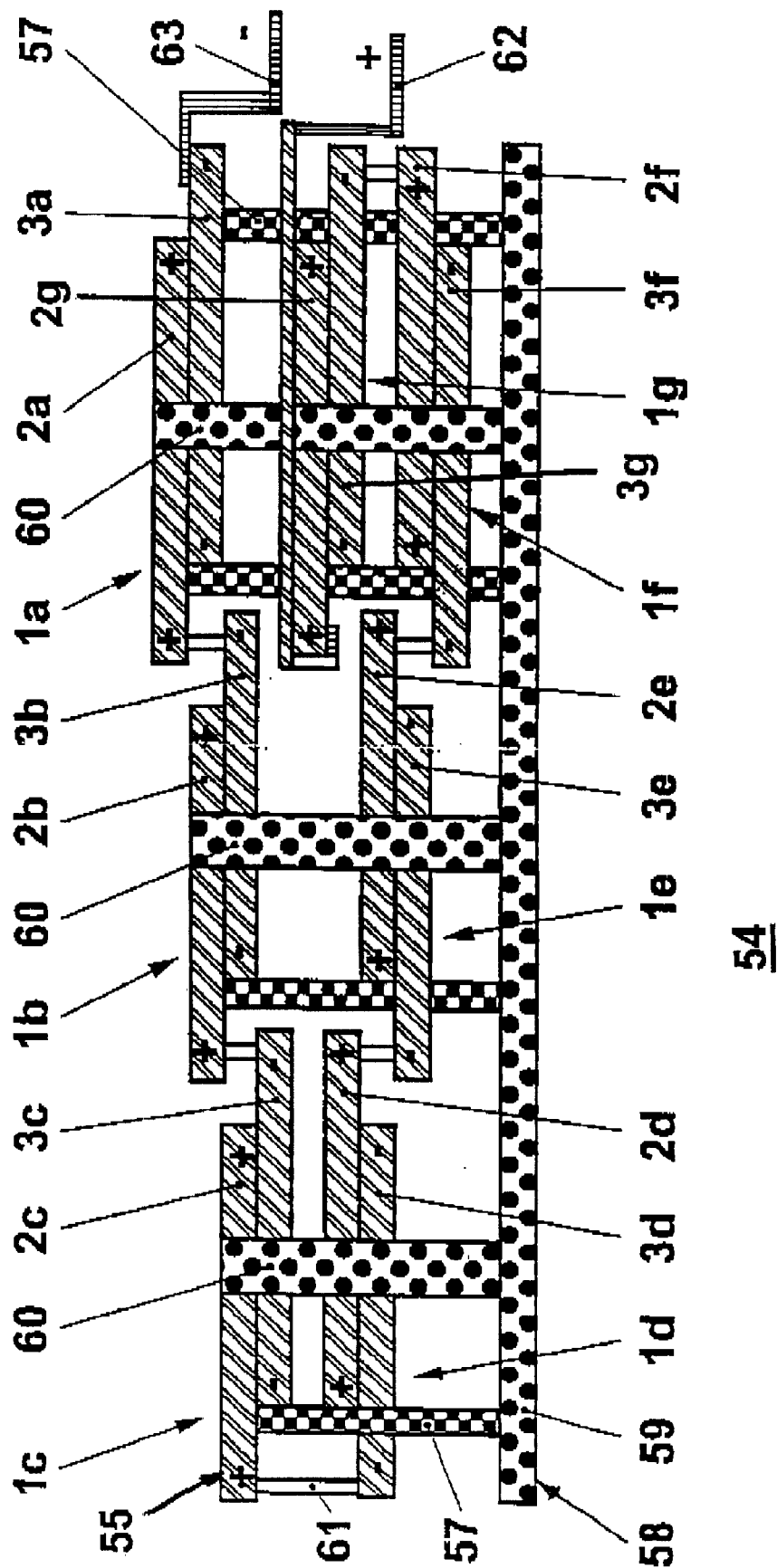

In FIG. 5, furthermore, an arrangement 54 of a plurality of photovoltaic cells 1a, 1b, 1c, 1d, 1e, 1f and 1g forming a solar module is shown in a cross-sectional view in which arrangement of the upper support pane 2a through 2c and 2g is offset towards the left hand side with respect to the lower support pane 3a through 3c and 3g, and where the upper support pane 2d through 2f protrudes towards the right hand side with respect to the lower support pane 3d through 3f, respectively. In the area of the protruding portion 55, a through bore or opening (not shown) is provided through which a support rod 57, provided with a support plate (not shown here in detail), passes. In this arrangement, the individual photovoltaic cells 1a through 1g are suspended unilaterally like leafs on tree branch. To the sides of the individual cells 1a through 1g, a holder system 58 with a base plate 59 and with support arms 60 is provided. The cells 1a through 1g are wired in series using electric circuit connections 61 and at the right hand end, as seen in the Figure, are provided with a positive contacting port 62 each and a negative contacting port 63 each. The whole arrangement 54 can be incorporated into a solar module without difficulties, as described in detail in the international patent application PCT/CH 00/00054, filed Feb. 1, 2000 by the same applicant, the contents of which is integrated into the present application by way of reference. In particular, additional support bars can be provided between the described glass substrates 2 and 3, described there in order to prevent bending of the glass substrates if the exterior dimensions exceed a certain size.

What is claimed is:

1. A method of manufacturing a photovoltaic cell having an electrically conducting coating on spaced, glass support panes provided with a circumferentially extending seal in their border zones, wherein the support panes are cleaned in a cleaning process; thereafter essentially parallel conductor leads are applied by a screen printing process on plane surfaces of the support panes at a temperature exceeding 500° C., and are dried and baked; and after a further cleaning process, the conductor leads are coated with an insulating coating and a surrounding seal is applied between the support panes.

2. A method according to claim 1, wherein a glass flow comprising a glass free of heavy metals is applied as the insulating coating and subsequently is cured in a kiln using near infrared radiation.

3. A method according to claim 2, wherein a plurality of layers of the glass flow are applied consecutively.

4. A method according to claim 1, wherein a further electrically conductive layer is applied to the conductor leads, which are provided with an insulating coating.

5. A method according to claim 1, wherein the support panes are subjected to a thermal pre-stressing process, are heated in a kiln to a temperature higher than 600° C., and then are shock-chilled.

6. A method according to claim 5, wherein the support panes are moved to and fro in a kiln subdivided into a plurality of heating zones, the temperatures in which increase step by step, at an oscillating frequency of about 0.5 seconds.

7. A method according to claim 1, wherein a first water vapor restricting seal made from silicon rubber is applied in a border zone between the two support panes.

8. A method according to claim 7, wherein additionally a second water vapor blocking barrier seal made from butyl rubber is applied on the first seal.

9. A photovoltaic cell comprising:
   (a) two support panes being arranged in parallel and at a distance from each other;
   (b) a surrounding seal provided at border zones of the support panes and arranged between the support panes to maintain said distance and to form a cell interior$_7$ the support panes being provided with an electrically conductive layer towards the cell interior;
   (c) a plurality of conductor leads arranged parallel to each other and positioned on top of a flat plane of each of said support panes internal to the cell interior;
   (d) an insulating coating applied on and directly contacting each of said conductor leads towards the cell interior; and
   (e) a photovoltaic substance provided between said conductor leads and filling said cell interior.

10. A photovoltaic cell according to claim 9, wherein the conductor leads comprise a material selected from the group consisting of: silver alloy, copper and a copper alloy.

11. A photovoltaic cell according to claim 9, wherein the insulating coating is substantially free of heavy metals, and comprises substantially no bismuth and/or tin.

12. A photovoltaic cell according to claim 9, wherein an additional electrically conductive layer is provided on top of the insulating coating.

13. A photovoltaic cell according to claim 9, wherein the surrounding seal comprises a first, water vapor restricting, seal made from silicon rubber.

14. A photovoltaic cell according to claim 13, wherein a second, water vapor blocking barrier seal made form butyl rubber is provided.

15. A photovoltaic cell according to claim 13, wherein the surrounding seal comprises a hot melt adhesive.

16. A photovoltaic cell according to claim 9, wherein the thickness of each of the support panes is not more than 3.5 mm.

17. A photovoltaic cell according to claim 16, wherein the thickness of each of the support panes is from 1.8 to 2.2 mm.

18. A photovoltaic cell according to claim 9, wherein the support panes are made of a colorless silicate glass.

19. A photovoltaic cell according to claim 9, wherein the electrically conductive layer comprises tin dioxide.

\* \* \* \* \*

UNITED STATES PATENT AND TRADEMARK OFFICE
CERTIFICATE OF CORRECTION

PATENT NO.    : 6,462,266 B1
DATED         : October 8, 2002
INVENTOR(S)   : Martin Kurth It is certified that error appears in the above-identified patent and that said Letters Patent is hereby corrected as shown below:

Column 3,
Line 1, replace "50 um to 70 um" with -- 50 mm to 70 mm --

Column 6,
Line 48, replace "barrier seal made form butyl" with -- barrier seal made from butyl --

Signed and Sealed this

Fourth Day of March, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,462,266 B1
DATED         : October 8, 2002
INVENTOR(S)   : Martin Kurth It is certified that error appears in the above-identified patent and that said Letters Patent is hereby corrected as shown below:

<u>Column 3,</u>
Line 1, replace "50 mm to 70 mm" with -- 50 $\mu$m to 70 $\mu$m --

Signed and Sealed this

Twenty-fourth Day of June, 2003

JAMES E. ROGAN
*Director of the United States Patent and Trademark Office*